United States Patent [19]

Appleby

[11] Patent Number: 4,857,832
[45] Date of Patent: Aug. 15, 1989

[54] METHOD OF AND APPARATUS FOR THE MEASUREMENT OF SLOWLY CHANGING OR STATIC ELECTRICAL POLARIZATION

[76] Inventor: James H. Appleby, 5, Tweddle Terrace, Bowburn, Co. Durham, United Kingdom, DH6 5AF

[21] Appl. No.: 155,857

[22] Filed: Feb. 16, 1988

[51] Int. Cl.⁴ .............................................. G01R 19/14
[52] U.S. Cl. ........................................ 324/72; 324/133
[58] Field of Search ............... 324/457, 458, 109, 452, 324/133, 72, 56; 307/127

[56] References Cited

U.S. PATENT DOCUMENTS

| | | | |
|---|---|---|---|
| 2,497,961 | 2/1950 | Shaw | 324/72 |
| 2,562,917 | 8/1951 | Hoty | 324/56 |
| 2,993,172 | 7/1961 | Karlicek | 324/133 |
| 3,021,514 | 2/1962 | Regis et al. | 324/133 |
| 3,249,929 | 5/1966 | Sillers, Jr. | 324/133 |
| 3,343,085 | 9/1967 | Ovshinsky | 324/110 |
| 3,452,346 | 12/1969 | Kupersmit | 324/72 |
| 3,786,348 | 1/1974 | Lynas et al. | 324/56 |
| 3,867,695 | 2/1975 | Lay, Jr. | 324/120 |
| 3,921,067 | 11/1975 | Mernone | 324/72 |
| 4,157,509 | 6/1979 | Zielinski | 307/360 |
| 4,241,373 | 12/1980 | Mara et al. | 324/133 |
| 4,634,971 | 1/1987 | Johnson et al. | 324/133 |
| 4,736,157 | 4/1988 | Betker et al. | 324/133 |

Primary Examiner—Reinhard J. Eisenzopf
Assistant Examiner—Maura K. Regan
Attorney, Agent, or Firm—Larson and Taylor

[57] ABSTRACT

The measurement of slowly changing or static electric potential or dielectric polarization is effected by an input circuit which comprises a pair of diodes a pair of resistors and a pair of switches. The diodes are connected in reverse parallel between an input terminal and a pair of output terminals. The circuit detects when the potential rises above a first voltage level, changes the input impedance thereof from high to low, detects when the potential has fallen below a second voltage level, and changes the input impedance back to high. Summation means is provided for summing the above changes in input impedance from which a determination can be made as to whether the potential is steady, increasing or decreasing. The switches are preferably Schmitt triggers having a hysteresis which represents the two reference voltages.

12 Claims, 5 Drawing Sheets

METHOD OF AND APPARATUS FOR THE MEASUREMENT OF SLOWLY CHANGING OR STATIC ELECTRICAL POLARIZATION

FIELD OF THE INVENTION

The present invention relates to a method of and apparatus for the measurement of electrical polarizations, particularly but not exclusively including in their total functional bandwith periods of slowly changing or static levels.

Induced electrical polarization, which for example may be produced in a piezoelectric transducer creates a difference of electric potential between conducting surfaces attached to the piezoelectric material. The problems associated with the measurement of electrical polarizations are due to leakage currents in the measuring device and in the example of piezoelectric transducers also within the body of the piezoelectric material. These leakage currents dissipate the charge which the polarization represents and have made the measurement of true static or slowly changing values previously unattainable.

DESCRIPTION OF THE PRIOR ART

Basically, there are three areas in which the measurement of slowly changing or static electrical polarization is used. These are:

(a) Field Mills
(b) Electrometers
(c) Charge Integrators.

Field Mills are basically electro-static field sensing apparatus. One form of known electro-static field sensing apparatus is disclosed in British Patent Specification No. 1,293,385. Electro-static field sensing apparatus generally comprises a fixed insulated metal structure which is alternately exposed to and then shielded from the electro-static field by a rotating screen plate. Periods of alternate exposure and screening are substantially equal thus providing a substantially symmetric signal waveform thus giving maximum sensitivity for a given size of field mill.

A. D.C. type electro-static voltmeter for measuring charge potentials, otherwise known as an electrometer is disclosed in British Patent Specification No. 1,580,560. In D.C. type electrometers, a constant signal output representative of the charge on the photoreceptive surface being viewed is produced. One disadvantage of D.C. type electrometers is that they have a tendency to drift after short periods of time.

An instrument which measures the surface potential of a charged body without substantially affecting the potential of the surface under examination is disclosed in British Patent Specification No. 1,542,837. This instrument includes an electrode which is brought into proximity with the object, and an electro-mechanical transducer which vibrates the electrode to produce a periodically varying capacitance between the electrode and the object. By applying a unidirectional voltage on the electrode, an A.C. signal is derived which is used to control the magnitude of the unidirectional voltage.

All the above systems suffer from the disadvantage that the readings which they derive are liable to error due to drift and/or leakage problems.

SUMMARY OF THE INVENTION

It is an object of the present invention to overcome this disadvantage by effectively removing the charge through the measuring apparatus either as small packets of equal size, created at a varying rate, or as small packets created or at a constant rate but varying in size, where these variations are a direct consequence of the input charge rate.

According to a first aspect of the present invention there is provided a method of measuring slowly changing or static electrical polarization, which includes the steps of:

(a) detecting when the polarization rises above a first voltage level;

(b) changing the input impedance of the measuring circuit from high to low when said first voltage level has been exceeded;

(c) detecting when the polarization has dropped to a second voltage level as a result of the low impedance change;

(d) changing the input impedance of the measuring circuit from low to high when the polarization falls below the second voltage level;

(e) summating the above changes (if any) of input impedance of the measuring circuit; and (f) determining from the summation whether the polarization is steady, increasing or decreasing.

Preferably the method is also applicable to negative polarizations, utilizing the above steps to detect a first voltage more negative than a second voltage and likewise switching the impedance of the circuit from high to low and then back to high when said first voltage level has been exceeded in a negative direction and the second voltage level has been exceeded in a positive direction.

The step of summing the above changes of input impedance may be done digitally.

According to a second aspect of the present invention there is provided apparatus for measuring slowly changing or static electrical polarization which includes:

(a) means for detecting when the polarization rises above a first voltage level;

(b) means for changing the input impedance of the measuring circuit from high to low when said first voltage level has been exceeded;

(c) means for detecting when the polarization has dropped to a second voltage as a result of the low impedance change;

(d) means for changing the input impedance of the measuring circuit from low to high when the polarization falls below the second voltage level;

(e) means for summing the above changes (if any) of input impedance of the measuring circuit; and (f) means for determining from the summation means whether the polarization is steady, increasing or decreasing.

Preferably said apparatus is also applicable to negative polarizations in which case voltage level means are provided for detecting first and second voltage levels, the first being more negative than the second, the switching means switching the circuit from high to low impedance and then back to high impedance at the detection of the first and second voltage levels.

The measuring circuit preferable includes a pair of diodes, a pair of resistors and a pair of switches, the diodes being connected in reverse-parallel relation about the input, the resistors and switches being paired in series between two reference voltages and connected to respective diodes at the output side thereof.

Said switches are preferably Schmitt triggers having a hysteresis which represents the two reference voltages in which case the resistors and reference voltages may be omitted.

Means may be provided to off-set the inputs to one or both of said Schmitt triggers so as to compensate for the slight discontinuity in operation due to the inherent forward bias voltages of the diodes, and due to neither of the Schmitt trigger voltages being zero.

BRIEF DESCRIPTION OF THE DRAWINGS

The present invention will now be described in greater detail by way of examples with reference to the accompanying drawings, wherein.

DESCRIPTION OF THE PREFERRED EMBODIMENTS

Figure 1:
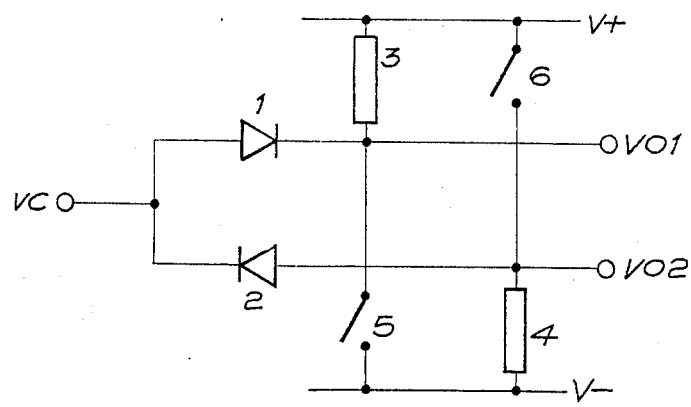
FIG. 1 is a circuit diagram to illustrate the principle on which the present invention is based.
Figure 2:
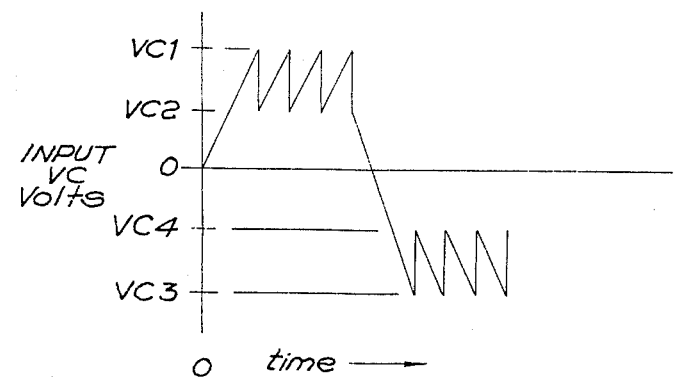
FIGS. 2A and 2B are waveform diagrams illustrating the operation of the circuit shown in FIG. 1.
Figure 2:
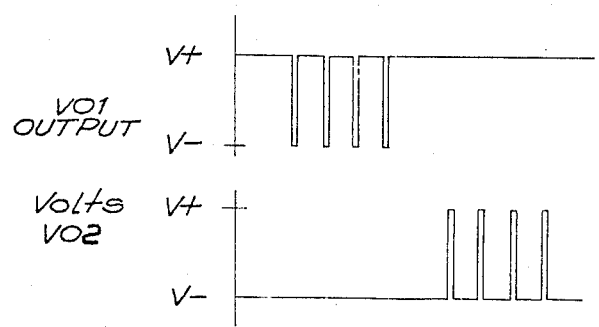

Referring to FIG. 1, the input circuit includes a pair of diodes 1 and 2; a pair of resistors 3 and 4 and a pair of switches 5 and 6, the elements being connected between an input terminal VC, two output terminals VO1 and VO2 and reference potentials V+ and V−. The diodes are connected in reverse parallel configuration, that is the diode 1 has its cathode connected to the output terminal VO1 and the diode 2 has its anode connected to the output terminal VO2, whilst the opposite electrodes are connected in common to the input terminal VC. The resistor 3 is connected between the cathode of the diode 1 and the reference potential V+, and the resistor 4 is connected between the anode of the diode 2 and the reference potential V−. The switch 5 is connected between the cathode of the diode 1 and the reference potential V−, and the switch 6 is connected between the anode of the diode 2 and the reference potential V+.

Consider an input of a rising level of charge. Due to the relationship of the level of charge present at the input from a charge producer and the capacitance of an input circuit a voltage will appear across the measuring terminals. With rising charge the voltage will also rise. If at some predetermined level of the voltage, the input circuit resistance were reduced to a very low level then the time constant would become very much shorter, the charge would dissipate at an exponential rate and the voltage would drop to a very low level. By reinstating the high circuit resistance and repeating the process for as long as there is any charge to measure then each rise and fall of voltage would represent a fixed portion of the total charge and the total number of such rises and falls of voltage would be representative of the total charge.

At the lowest level the minimum circuit to achieve the effective digitisation of charge consists of the two diodes 1 and 2, the two resistors 3 and 4, and the two switches 5 and 6 shown in FIG. 1. Charge at the input represented by VC will appear across the diode 2 which will be directly equivalent to the charge. As long as this voltage is less than the reference potential V+ which appears at the cathode of the diode 1 then that diode is effectively blocked with no forward current flow. With changes in the input charge level the voltage VC will also change. Considering a rising charge, if when the voltage reaches a particular fixed level of Vc1 the switch 5 is closed until the voltage falls to another fixed level of VC2 where the switch is reopened, then the output VO1 would go through a double level change from V+ to V− then back to V+. The process for a falling level of charge input is identical to that for rising charge excepting that the diode 1 this time is the one which produces the time constant and the diode 2 and the switch 6 being the active components giving a pulse at the output VO2, the switch 6 opening and closing at the voltage levels of VC3 and VC4. During the time in which the switches 5 and 6 are closed the time constant of the circuit is substantially reduced, causing part of the input charge to be dissipated or negated by controlling either one or both of the applied voltage and the time constant to ensure that the input charge is brought to earth before resuming the high input impedance for the beginning of the next packet of charge.

In practice by choosing diodes which have a very low reverse leakage, i.e. less than $10^{-11}$ amps per volt it is thus practical to measure slowly changing or static electrical potentials very close to zero volts.

Furthermore, in practice the switches 5 and 6 would be some form of electronic switches which would automatically change when the input voltage VC passed the fixed states of VC1, VC2, VC3 and VC4. Such electronic switches would include simple transistor circuits, thyristors, or specialized silicon switching circuits. However, for the best results there is a family of circuits which have as their basic constituent a circuit called a Schmitt trigger. Schmitt triggers are bistable, that is their output remains in one of two states which changes whenever the input passes through one and then the other of two predetermined levels which are called the triggering voltages. Switch over from one output condition to the other is extremely rapid which is the main reason for their choice in this application because it will minimize losses and ensure the highest possible frequency response. The difference between the two predetermined levels is the hysterisis of the circuit.

Figure 3:
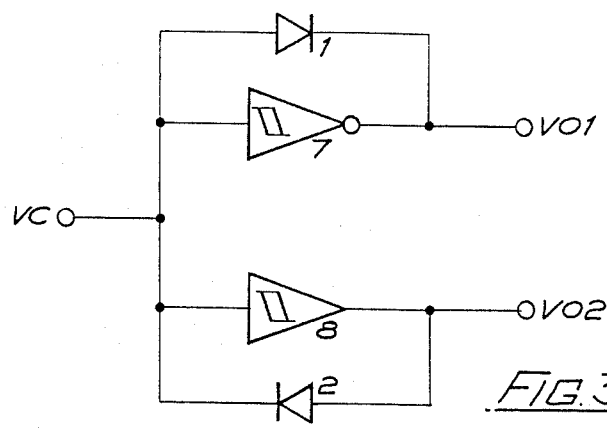
FIGS. 3 and 4 are different arrangements of the circuit shown in FIG. 1, in which the switches are replaced by Schmitt triggers.
Figure 4:
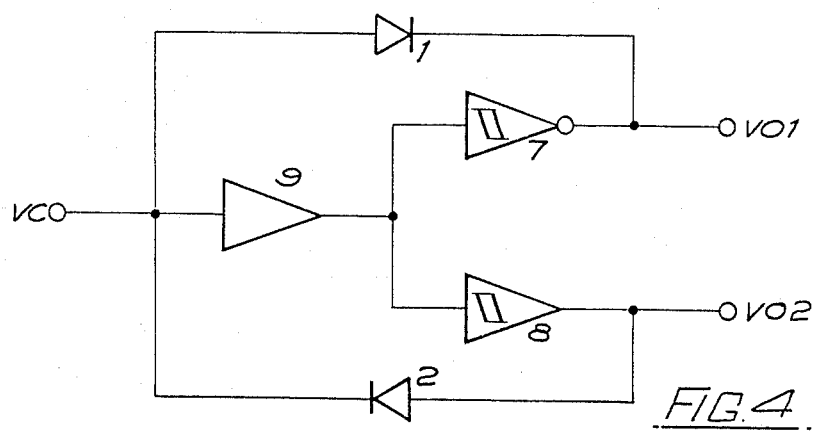

Circuits which utilize Schmitt triggers are shown in FIGS. 3 and 4. As shown in FIG. 3, a pair of Schmitt trigger circuits 7 and 8 are effectively connected in parallel with respective diodes 1 and 2 between input terminal VC and respective output terminals VO1 and VO2. The Schmitt trigger circuit 7 is an inverting Schmitt trigger having the parameters of VC1 and VC2. It should be noted that an inverting Schmitt trigger is one in which the output changes from high to low when a rising input passes the higher triggering value. The Schmitt trigger circuit 8 is a non-inverting Schmitt trigger having the parameters of VC3 and VC4.

In order to ensure that during changes of direction in the value of the input charge between the equivalent voltages of VC1 and VC3 there is no loss of measuring accuracy, it would be preferable that both VC2 and VC4 were zero. Where this might create difficulties in practice due either to the forward bias of the diodes 1 and 2 or to the value of the hysteresis of the Schmitt triggers, then this may be overcome by using a circuit which gives an offset of the same value as VC2 to the input before the Schmitt triggers.

Figure 5:
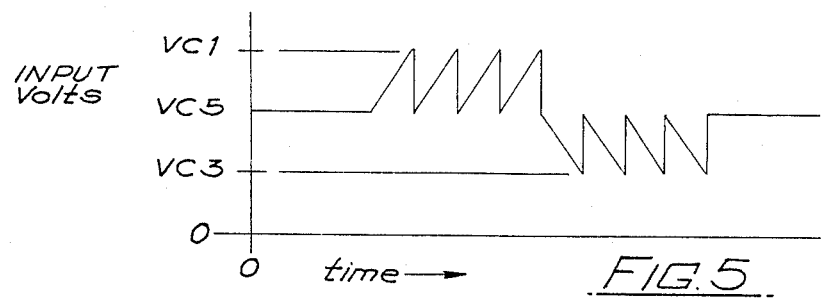
FIG. 5 is a waveform diagram illustrating the operation of the circuits shown in FIGS. 3 and 4.

An appropriate additional circuit which can effectively reduce the difference between the value of VC2 and VC4 to zero is an amplification stage 9 shown in FIG. 4. The circuit of FIG. 4 otherwise contains the same components, namely the diodes 1 and 2 and the Schmitt trigger circuits 7 and 8, the Schmitt trigger circuit 7 again being an inverting Schmitt trigger. As shown, the amplification stage 9 is connected between the input terminal VC and the paralleled inputs to the Schmitt triggers 7 and 8. Thus, as shown in FIG. 5, the voltage levels VC2 and VC4 are effectively the same value being indicated by VC5. It will be noted that the amplification stage effectively raises the output from the Schmitt trigger circuit 8 above zero on the positive side.

Figure 6:
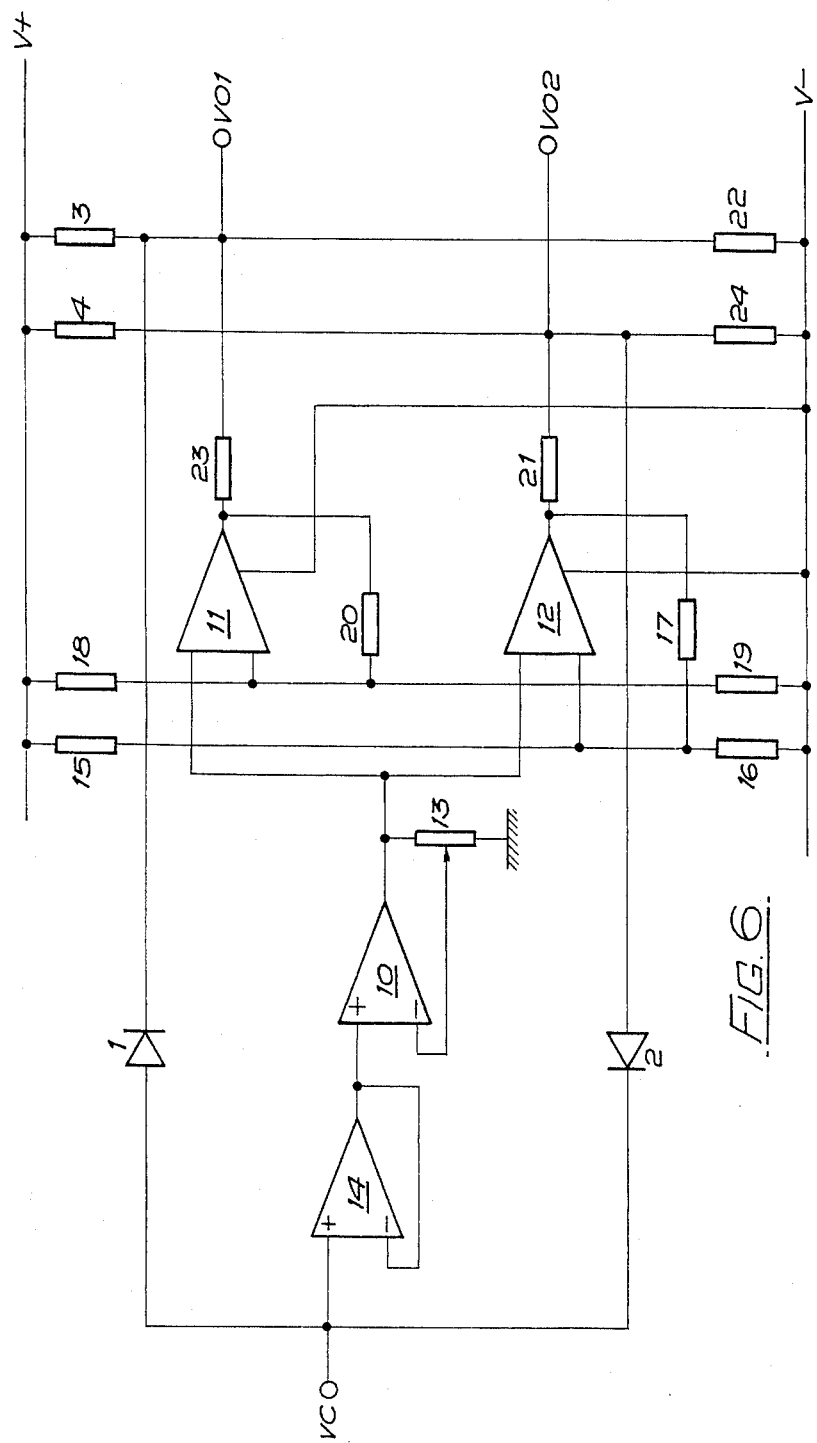
FIG. 6 is a circuit diagram of a first preferred embodiment of an apparatus for measurement of slowly changing or static electrical polarization.

Referring now to FIG. 6, which shows a preferred embodiment of apparatus for the measurement of slowly changing or static electrical polarization, the circuit again includes the diodes 1 and 2 together with the resistors 3 and 4. In addition it includes resistors 15 to 24, a pair of comparators 11 and 12, a first stage buffer amplifier 14, a second stage non-inverting amplifier 10 with a gain control potentiometer 13. The first stage amplifier 14 has its non-inverting input connected to the junction between the diodes 1 and 2 and its inverting input connected to its output. The output from the first stage amplifier 14 is connected to the non-inverting input of the second stage amplifier 10. The second stage amplifier 10 has its inverting input connected to the tap of the potentiometer 13. The output of the second stage amplifier 10 is connected to the inputs of the comparators 11 and 12 which are in parallel. The first stage amplifier 14 has a high input impedance and may be a circuit using field effect transistors. The final stage is a pair of comparators 11 and 12 which are special circuits incorporating Schmitt triggers with the ability to set the triggering voltage and hysterisis externally. This is achieved by the use of a resistor network made up of resistors 15, 16 and 17 for the comparator 12 and resistors 18, 19 and 20 for the comparator 11. The voltage VC5 in this case could be zero. The input impedance of the circuit is given by the diodes 1 or 2 in parallel with the amplified 10. The resistor 21 sets the reverse bias voltage for the diode 2 by acting as a potential divider with the resistor 4. The resistor 22 sets the reverse bias voltage for the diode 1 by acting as a potential divider with the resistor 3. These reverse bias voltages effectively block the diodes when the input voltage VC lies between the voltages VC1 and VC3. The resistor 23 in parallel with the resistor 22 and in series with the resistor 3 sets the forward bias of diode 1. The resistor 24 in parallel with the resistor 21 and in series with the resistor 4 sets the forward bias of the diode 2. A rising input charge would create a voltage Vc across the diode 2 and the amplifier 14 which on reaching the value of VC1 causes the comparator 11 to change to its low impedance state causing the voltage VC to reduce rapidly, which in turn causes the comparator to return to its high impedance condition. The process for a falling charge level is similar, except that the normal condition of the comparator 12 is a low impedance after crossing the voltage VC5 and a high impedance after crossing VC3. Overall gain of the circuit is chosen to match the input parameters with number of output pulses and would be quoted as the number of picocoulombs per pulse. Gain can be controlled either by the potentiometer 13 to alter the gain of the amplifier 10 or the references voltages VC1 or VC3 could be altered to change the triggering levels.

The essential parameters of this charge measuring circuit are the two time constants. Another way to state this is to say that it is a circuit whose input impedance can by some switching means be made alternatively high and low. The ratio of the time constants is a measure of the efficiency of the measurement. To optimise this efficiency consider voltage VC5 at time T1 increasing to VC1 at time T2 then decreasing to VC5 at time T3 then $(T2-T1)/(T3-T2)$ must be as high as possible for the highest efficiency. All that remains to make these circuits into completely measuring instruments is that some means of counting the output pulses is required and a digital display. This could take the form of standard electronic counters with the ability to count both up and down in order to keep a running total of both positive and negative excursions of the input.

Thus, the circuit described in basic terms shown in FIG. 1 can be conveniently referred to as a charge negation circuit. In addition the complete instrument includes control circuits, pulse shaping circuits and measuring circuits all of which are external to the charge negation circuit and are well known circuits. To account for a step input the first stage amplifier 14 may be an integrator. In such a case the second stage amplifier 10 is an inverter. Such a complete circuit is that shown in FIG. 6.

Figure 7A:
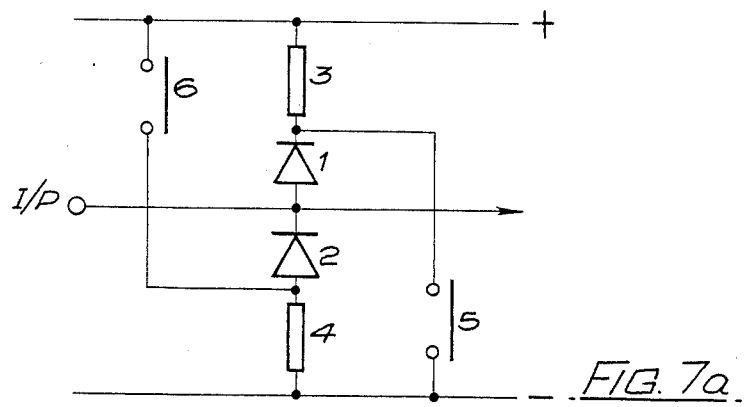
FIG. 7a, 7b and 7c illustrate examples of different types of input circuit which may be used with the apparatus shown in FIG. 6.
Figure 7B:
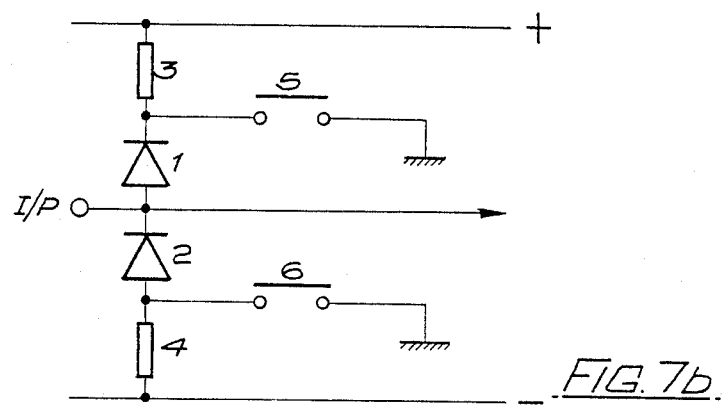
Figure 7C:
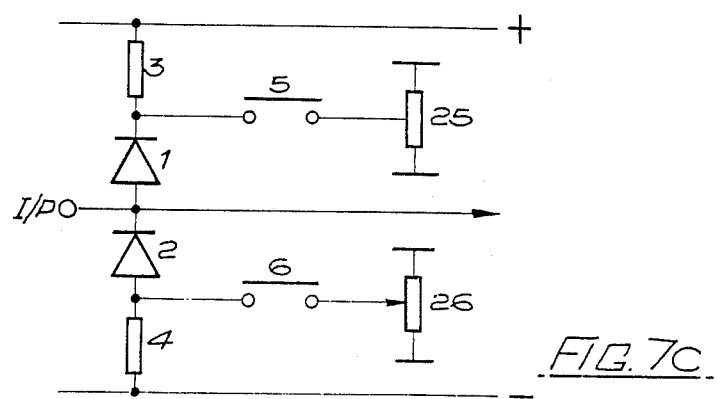

FIGS. 7a, 7b and 7c show three basic ways in which the charge negation circuit may be constructed, with the diodes, resistors and switches being referred to as in FIG. 1. The first basic way corresponds to what has already been described. In the second basic way shown in FIG. 7b, one side of each of the switches is earthed. This circuit only operates satisfactorily when the switches can be closed for a relatively long period. In the third basic way shown in FIG. 7c one side of the switches 5 and 6 is connected to the top of respective potentiometers 25 and 26 whose ends are connected to the reference voltages V+ and V−. The function of the potentiometers 25 and 26 is to set the forward bias across the diodes 1 and 2.

As mentioned above, the switches 5 and 6 within the charge negation circuit can be of any type, namely mechanical, electrical, electro-magnetic electronic, the only criterion being one of speed of operation in order to measure reasonably small values of charge.

The control circuits are designed to create a pulse whose action upon the switches of the charge negation circuit divides the input charge into small packets. With the switches open, changes may build up, whilst on closing them, the charge is negated.

Figure 8:
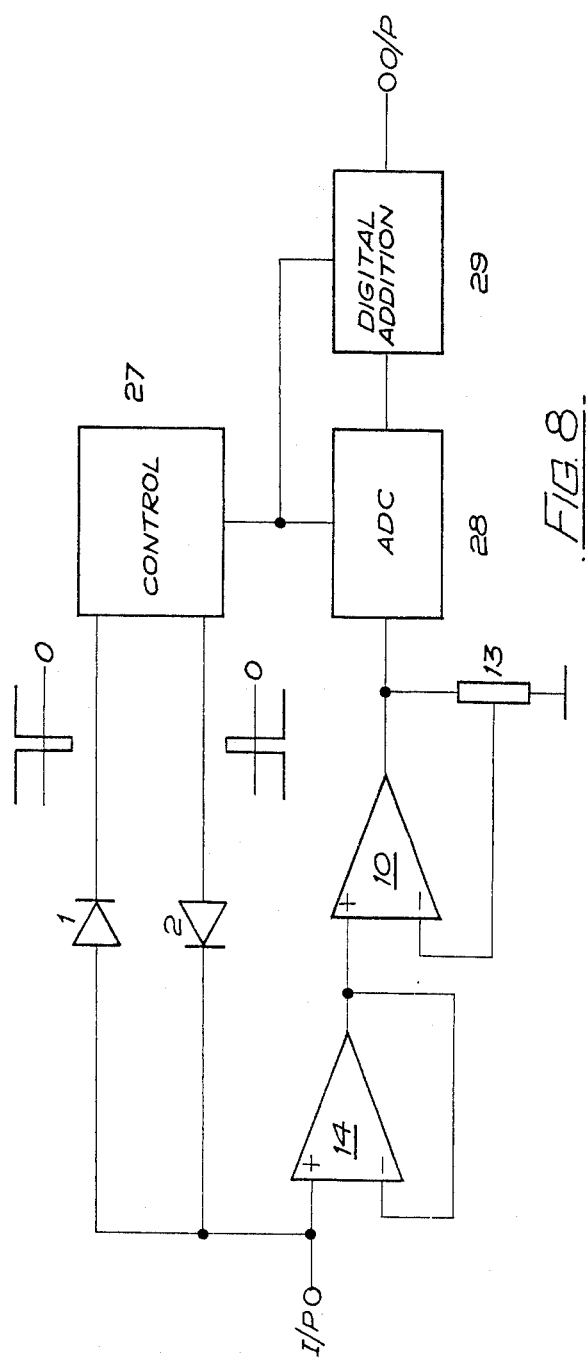
FIG. 8 is a circuit diagram of a second preferred embodiment.

Referring now to FIG. 8 which shows a second preferred embodiment of an apparatus for the measurement of slowly changing or static electrical polarization, the circuit again includes the diodes 1 and 2, the first stage buffer amplifier 14, and the second stage amplifier 10 provided with the gain control potentiometer 13 as shown in FIG. 6. In addition the circuit of this second embodiment includes an analog-to-digital converter 27, a control circuit 28, and a digital addition circuit 29. The output of the second stage amplifier 10 is connected to the analog-to-digital converter 27. The control circuit 28 supplies timing pulses to control the function of the converter 27 and digital addition circuit 29. In phase with the control pulses and with each other, are a further two pulse trains which are fed from the control circuit 28 to the two diodes 1 and 2. These two pulse trains at their normal levels represent the chosen diode reverse bias levels, while the levels during their pulses represent at least the required forward bias levels for the diodes 1 and 2. The output from the analog-to-digital converter 27 is connected to the digital converter 27 is connected to the digital addition circuit 29.

Pulse shaping may be part of the control circuit function or may be separate. The requirement of pulse shaping may be one or both of the following:

(a) creating digital pulses which can be processed externally, (b) control of the level or duration of charge negation.

Control and pulse shaping have to fulfill the following criteria:

(a) that during charge negation sufficient time is given to bring the input down substantially to earth potential, (b) the charge negation is done in such a way that the measuring circuit is given the correct date, (c) that the charge negation time scale is a small proportion of the total cycle time.

Finally, the measuring circuits can be of two basic types, namely:

(a) ones which count the number of packets and rely on a control circuit which divides up the input charge with those of equal level, (b) those which measure the value of each packet where the control circuit divides the charge into those of equal duration.

The above described apparatus for the measurement of slowly changing or static electrical potentials thus eliminates leakage problems by removing the charge through the measuring apparatus in small packets of equal size or equal duration from one electrode to the other and either counting the number of packets transferred or measuring the value of each packet transferred, maintaining the potential across the measuring terminals close to zero. For changing levels of potential the number of packets of charge per unit time is directly equivalent to the input charge rate in coulombs per unit time.

What is claimed is:

1. A method for measuring changes in electrical polarization utilizing a measuring circuit, the method including the steps of:
    (a) detecting when the polarization reaches a first voltage level;
    (b) changing the input impedance of the measuring circuit from high to low when said first voltage level has been reached;
    (c) detecting when the polarization has reached a second voltage level as a result of the low impedance change;
    (d) changing the input impedance of the measuring circuit from low to high when the polarization reaches the second voltage level;
    (e) summing over a period of time the number of occurrences of the changes of input impedance of the measuring circuit set forth in steps (b) and (d); and
    (f) determining from the summation the magnitude of the change in electrical polarization.

2. The method according to claim 1 wherein the method is applied to positive polarizations, utilizing the above steps to detect a first voltage more positive than a second voltage and switching the impedance of the circuit from high to low and then back to high when said first voltage level has been exceeded in a positive direction and the second voltage level has been exceeded in a negative direction.

3. A method according to claim 1, wherein the method is applied to negative polarizations, utilizing the above steps to detect a first voltage more negative than a second voltage and switching the impedance of the circuit from high to low and then back to high when said first voltage level has been exceeded in a negative direction and the second voltage level has been exceeded in a positive direction.

4. The method according to claim 1, wherein the step of summing the changes of input impedance is carried out digitally.

5. A measuring circuit for measuring changes in electrical polarization which includes:
    (a) first detecting means for detecting when the polarization reaches a first voltage level;
    (b) means, responsive to said first detecting means, for changing the input impedance of the measuring circuit from high to low when said first voltage level has been reached;
    (c) second detecting means for detecting when the polarization has reached a second voltage as a result of the impedance of said measuring circuit being changed from high to low;
    (d) means, responsive to said second detecting means, for changing the input impedance of the measuring circuit from low to high when the polarization reaches the second voltage level;
    (e) summing means for summing over a period of time the number of occurrences of changes of input impedance of the measuring circuit; and
    (f) means, responsive to the summing means, for determining the magnitude of the change in electrical polarization.

6. A measuring circuit according to claim 5, wherein said measuring circuit is applicable to positive polarizations, and wherein said first and second detecting means comprise, respectively, a first voltage level detector means for detecting a first voltage level and a second voltage level detector means for detecting a second voltage level which is less positive than the first level, said means for changing the input impedance of the measuring circuit comprising switching means for switching the circuit from high to low impedance and then back to high impedance upon the detection of the first and second voltage levels.

7. A measuring circuit according to claim 5, wherein said measuring circuit is applicable to negative polarizations and wherein said first and second detecting means comprise, respectively, a first voltage level detector means for detecting a first voltage level and a second voltage level detector means for detecting a second voltage level which more negative than the first level, said means for changing the input impedance of the measuring circuit comprising switching means for switching the circuit from high to low impedance and then back to high impedance upon the detection of the first and second voltage levels.

8. A measuring circuit according to claim 5, wherein said circuit includes a common input terminal, a pair of output terminals, two reference voltages, a pair of diodes, a pair of resistors and a pair of switches, the diodes being connected in reverse-parallel relation between the common input terminal and respective output terminals, the resistors and switches being paired in series between respective ones of the two reference voltages and being connected to respective diodes and respective output terminals.

9. A measuring circuit according to claim 5, wherein said circuit includes a common input terminal, a pair of output terminals, a pair of diodes, and a pair of Schmitt triggers, the diodes being connected in reverse parallel relation between the common input terminal and respective output terminals, the Schmitt triggers having a hysteresis representing two reference voltages and being connected in parallel between the common input terminal and the respective output terminals, one of said Schmitt triggers being an inverting Schmitt trigger.

10. A measuring circuit according to claim 5, wherein said circuit includes a common input terminal, a pair of output terminals, a pair of diodes, a pair of Schmitt triggers and an amplifier, the diodes being connected in reverse parallel relation between the common input terminal and respective output terminals, the amplifier having the input thereof connected to said input terminal and the output thereof connected to the inputs to both Schmitt triggers, the Schmitt triggers having a hysteresis representing two reference voltages and being connected in parallel between the amplifier and the respective output terminals, one of said Schmitt triggers being an inverting Schmitt trigger.

11. A measuring circuit according to claim 5, wherein said circuit includes a common input terminal, a pair of output terminals, two reference voltages, a pair of diodes, two pairs of resistors, a pair of comparators, a buffer amplifier, and a non-inverting amplifier, the diodes being connected in reverse parallel relation between the common input terminal and respective output terminals, the resistors forming two potential dividers between the two reference voltages, the centers of which are connected to respective of said output terminals, the buffer amplifier being connected between the input terminal and one input of the non-inverting amplifier, the non-inverting amplifier being connected between the output of the buffer amplifier and one input of each comparator, and the comparators being connected in parallel between the non-inverting amplifier and the respective output terminals.

12. A measuring circuit according to claim 11, wherein said comparators each incorporate a Schmitt trigger and wherein a resistor network is provided for each comparator to enable the triggering voltage thereof and hysteresis to be set externally.

* * * * *